US010952351B2

(12) United States Patent
Park et al.

(10) Patent No.: US 10,952,351 B2
(45) Date of Patent: Mar. 16, 2021

(54) DISPLAY DEVICE

(71) Applicant: LG Display Co., Ltd., Seoul (KR)

(72) Inventors: JongYoung Park, Paju-si (KR); JinYoung Bang, Paju-si (KR); Jikwang Jang, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/858,310

(22) Filed: Apr. 24, 2020

(65) Prior Publication Data

US 2020/0260612 A1    Aug. 13, 2020

Related U.S. Application Data

(63) Continuation of application No. 15/817,239, filed on Nov. 19, 2017, now Pat. No. 10,674,632.

(30) Foreign Application Priority Data

Nov. 24, 2016    (KR) .................. 10-2016-0157470

(51) Int. Cl.
| | |
|---|---|
| *H05K 7/20* | (2006.01) |
| *H05K 1/02* | (2006.01) |
| *H05K 5/00* | (2006.01) |
| *H05K 5/02* | (2006.01) |
| *H05K 5/03* | (2006.01) |
| *G02F 1/1345* | (2006.01) |
| *G02F 1/1333* | (2006.01) |

(52) U.S. Cl.
CPC ....... *H05K 7/2039* (2013.01); *G02F 1/13452* (2013.01); *G02F 1/133308* (2013.01); *G02F 1/133382* (2013.01); *H05K 1/028* (2013.01); *H05K 5/0017* (2013.01); *H05K 5/0243* (2013.01); *H05K 5/03* (2013.01); *H05K 7/20963* (2013.01); *G02F 2001/133314* (2013.01)

(58) Field of Classification Search
CPC ...... G06F 1/1601; G06F 1/203; G06F 1/1613; G06F 1/1626; G06F 1/1637; H01L 51/56; H01L 51/5237; H01L 51/529
USPC ......... 361/707, 711, 679.24, 679.54; 349/58; 174/556
See application file for complete search history.

(56) References Cited

U.S. PATENT DOCUMENTS 7,855,891 B1    12/2010  Ayres, III et al.
10,019,029 B1*    7/2018  Yu ........................... G06F 1/183
10,101,958 B2    10/2018  Kim et al.
(Continued)

FOREIGN PATENT DOCUMENTS

| CN | 1620244 A | 5/2005 |
|---|---|---|
| CN | 101109857 A | 1/2008 |

(Continued)

OTHER PUBLICATIONS

Chinese Office Action issued in co-pending Chinese Patent Application No. 201711172196.2 dated Sep. 27, 2019.
(Continued)

*Primary Examiner* — Zachary Pape
*Assistant Examiner* — Amir A Jalali
(74) *Attorney, Agent, or Firm* — Polsinelli PC

(57) ABSTRACT

A narrow-bezel display device. A bezel in outer peripheral portions of the display device is reduced. A plurality of circuit films, a printed circuit board, and the like, connected to a display panel, are protected. Heat dissipation performance is improved.

9 Claims, 10 Drawing Sheets

(56) References Cited

U.S. PATENT DOCUMENTS

| | | | |
|---|---|---|---|
| 10,114,498 B2* | 10/2018 | Ahn | G09G 3/20 |
| 2005/0088093 A1 | 4/2005 | Kim et al. | |
| 2006/0152905 A1 | 7/2006 | Kim et al. | |
| 2006/0178267 A1 | 8/2006 | Kim et al. | |
| 2007/0117418 A1* | 5/2007 | Azuma | G02F 1/133308 |
| | | | 439/67 |
| 2008/0018626 A1 | 1/2008 | Yang et al. | |
| 2008/0068313 A1 | 3/2008 | Jang | |
| 2010/0085334 A1 | 4/2010 | Kim et al. | |
| 2010/0315769 A1 | 12/2010 | Mathew et al. | |
| 2011/0292317 A1 | 12/2011 | Kim et al. | |
| 2011/0310545 A1 | 12/2011 | Liu | |
| 2012/0044636 A1 | 2/2012 | Rothkopf et al. | |
| 2012/0224338 A1 | 9/2012 | Park et al. | |
| 2012/0327328 A1 | 12/2012 | Kim et al. | |
| 2013/0162506 A1 | 6/2013 | Kim et al. | |
| 2013/0170116 A1* | 7/2013 | In | H05K 7/00 |
| | | | 361/679.01 |
| 2013/0341597 A1 | 12/2013 | Kim | |
| 2013/0342746 A1* | 12/2013 | Ueda | H04N 5/2252 |
| | | | 348/333.01 |
| 2013/0342779 A1 | 12/2013 | Jung et al. | |
| 2014/0002969 A1 | 1/2014 | Hwang | |
| 2014/0092631 A1 | 4/2014 | Fujii et al. | |
| 2014/0103315 A1 | 4/2014 | Jung et al. | |
| 2014/0151654 A1* | 6/2014 | Ryu | H05K 1/028 |
| | | | 257/40 |
| 2014/0293184 A1 | 10/2014 | Sugamura | |
| 2015/0002936 A1 | 1/2015 | Jun et al. | |
| 2015/0230331 A1 | 8/2015 | Lee | |
| 2015/0268410 A1 | 9/2015 | Yu | |
| 2015/0316810 A1* | 11/2015 | Shibahara | G02F 1/133382 |
| | | | 349/150 |
| 2016/0021773 A1 | 1/2016 | Yun et al. | |
| 2016/0026030 A1 | 1/2016 | Kang et al. | |
| 2016/0027861 A1 | 1/2016 | Jung et al. | |
| 2016/0218153 A1 | 7/2016 | Kim | |
| 2016/0349567 A1* | 12/2016 | Kwon | G02F 1/133308 |
| 2016/0363803 A1* | 12/2016 | Kim | G02F 1/13452 |
| 2016/0371558 A1* | 12/2016 | Lee | G02F 1/1333 |
| 2017/0034928 A1* | 2/2017 | Kwon | G02F 1/133308 |
| 2017/0086296 A1 | 3/2017 | Lee et al. | |
| 2017/0135213 A1* | 5/2017 | Lee | G02F 1/1333 |
| 2017/0164485 A1* | 6/2017 | Jung | G02F 1/13452 |
| 2017/0345874 A1* | 11/2017 | Kim | B22C 7/026 |
| 2018/0027671 A1* | 1/2018 | Kang | G06F 1/1601 |
| | | | 361/707 |

FOREIGN PATENT DOCUMENTS

| | | |
|---|---|---|
| CN | 102655721 A | 9/2012 |
| CN | 103176303 A | 6/2013 |
| CN | 103676321 A | 3/2014 |
| CN | 103730483 A | 4/2014 |
| CN | 204652825 U | 9/2015 |
| CN | 205620644 U | 10/2016 |
| JP | 2000-242189 A | 9/2000 |
| JP | 2005-049686 A | 2/2005 |
| JP | 2005-128533 A | 5/2005 |
| JP | 2007-121709 A | 5/2007 |
| JP | 2008287293 A | 11/2008 |
| JP | 2008-292699 A | 12/2008 |
| JP | 2010-239323 A | 10/2010 |
| JP | 2014-006345 A | 1/2014 |
| TW | 200641444 A | 12/2006 |
| WO | WO 2015-087463 A1 | 6/2015 |

OTHER PUBLICATIONS

Office Action dated Feb. 28, 2019 issued in the corresponding Japanese Patent Application No. 2017-223611: pp. 1-5.
Office Action with English translation dated Oct. 9, 2018 issued in the corresponding Taiwanese Patent Application No. 106138662, pp. 1-18.
Office Action dated Sep. 18, 2018 with English translation issued in the corresponding Japanese Patent Application No. 2017-223611, pp. 1-14.

* cited by examiner

DISPLAY DEVICE

CROSS REFERENCE TO RELATED APPLICATION

This application is a continuation of U.S. patent application Ser. No. 15/817,239, filed on Nov. 19, 2017, which claims the priority benefit of Korean Patent Application No. 10-2016-0157470, filed on Nov. 24, 2016, which are hereby incorporated by reference in their entirety for all purposes as if fully set forth herein.

BACKGROUND

Field of the Disclosure

The present disclosure relates to a display device, and more particularly, to a display device with a reduced bezel in outer peripheral portions thereof while protecting a plurality of circuit films, a printed circuit board, and the like, connected to a display panel and improving heat dissipation performance.

Description of the Background

In general, research into flat panel display devices, including liquid crystal display (LCD) devices, plasma display panel (PDP) devices, field emission display (FED) devices, light-emitting display devices, and the like, has been actively undertaken. Among such flat panel display devices, LCD devices and light-emitting display devices have come to prominence, due to advantages thereof, such as adaptability to mass production, easy implementation of a driving unit, as well as the realization of high resolution.

Recently, research into, and development, of flat panel display devices has been particularly required in terms of designs with high consumer appeal, as well as technical aspects.

In this regard, attempts to realize a display device having a slimmed profile or a minimized thickness have consistently been undertaken. In addition, requests for slimmed or aesthetically-enhanced designs able to stimulate sales by appealing to the aesthetic sense of consumers are gradually increasing.

However, according to the development of designs for slimmed or aesthetically-enhanced display devices that has been undertaken to date, components of display devices of the related art have been used by only modifying the structures thereof. Thus, the ability to develop slimmed display devices or new designs has been limited.

In particular, in display devices having an ultra-high resolution or a large area, research and development have been actively undertaken into narrow-bezel display devices in which the area of peripheral portions is reduced, or borderless display devices from which the peripheral portions are removed in order to satisfy design demands of consumers.

A narrow-bezel display device or a borderless display device, from which peripheral portions are removed, will be described with reference to FIGS. 1 and 2. A display device of the related art includes: a set cover 100 having an accommodation space defined by a set plate 111 and set sidewalls 112; a guide frame 120 seated in the set cover 100 to be received in the accommodation space; a display unit 130 including a display panel 131 seated in the guide frame 120; a circuit-accommodating portion 150 provided between one side surface of the guide frame 120 and one sidewall of the set sidewalls 112, in parallel to the one surface of the guide frame 120; a plurality of circuit films 134 disposed in the circuit-accommodating portion 150 to be connected to the display panel 131; a printed circuit board (PCB) 135 disposed in the circuit-accommodating portion 150 to be connected to the plurality of circuit films 134; a backlight unit 132; and a decorative cover 140 covering the circuit-accommodating portion 150.

The decorative cover 140 is coupled to the one side surface of the guide frame 120 and the one sidewall of the set sidewalls 112, in parallel to the one side surface of the guide frame 120, to cover the space between the one side surface of the guide frame 120 and the one sidewall of the set sidewalls 112, i.e. the circuit-accommodating portion 150, thereby protecting the PCB 135 and the plurality of circuit films 134. In this regard, the decorative cover 140 includes a plurality of first and second coupling members 142 and 143.

According to such a display device, however, the decorative cover 140 covers the front side of the circuit-accommodating portion 150, thereby increasing the width of the front edges of the display device, in particular, the width W1 of the area in which the circuit films 134 are disposed. This consequently hinders the ability to form a variety of innovative designs demanded by consumers.

In particular, since the size of panels is gradually increasing, reducing the bezel width has been at the forefront in terms of technological aspects. Studies for minimizing the bezel width of display devices while protecting internal components of display devices, such as circuit films and PCBs, are necessary.

SUMMARY

Various aspects of the present disclosure provide a display device having a narrow bezel, a slimmed profile, and a light weight, in which the width of peripheral portions of the front surface is significantly reduced.

Also provided is a display device configured to protect a plurality of circuit films, a printed circuit board (PCB), and the like connected to a display panel and improve heat dissipation performance while significantly reducing the width of the peripheral portions of the front surface.

The present disclosure is not limited to the aforementioned description, and other objects not explicitly disclosed herein will be clearly understood by a person skilled in the art from the description provided hereinafter.

According to an aspect of the present disclosure, provided is a narrow-bezel display device configured to reduce a bezel in outer peripheral portions thereof while protecting a plurality of circuit films, a printed circuit board, and the like, connected to a display panel and improving heat dissipation performance.

According to exemplary aspects, a display device can have a narrow bezel, a slimmed profile, and a light weight, in which the width of peripheral portions of the front surface is significantly reduced.

In addition, according to exemplary aspects, it is possible to protect a plurality of circuit films, a PCB, and the like connected to a display panel and improve heat dissipation performance while significantly reducing the width of the peripheral portions of the front surface.

It is to be understood that both the foregoing general description and the following detailed description are exemplary and explanatory and are intended to provide further explanation of the disclosure as claimed.

BRIEF DESCRIPTION OF THE DRAWINGS

The above and other objects, features and advantages of the present disclosure will be more clearly understood from the following detailed description when taken in conjunction with the accompanying drawings, in which.

DETAILED DESCRIPTION

Figure 1:
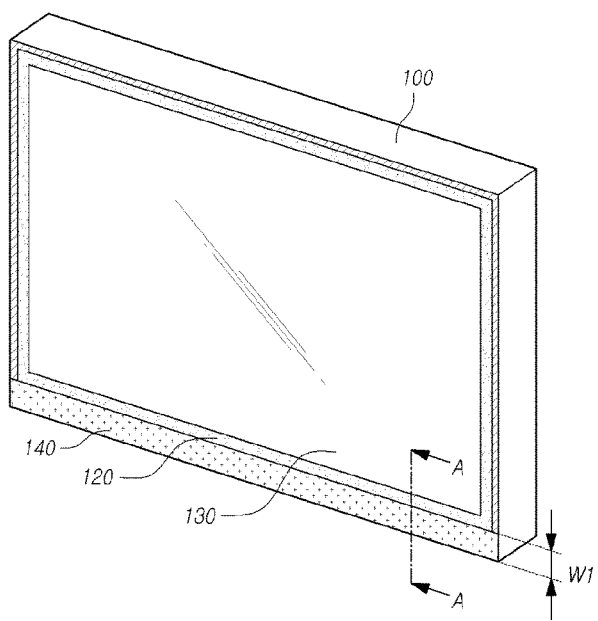
FIG. 1 is a perspective view illustrating a typical display device.
Figure 2:
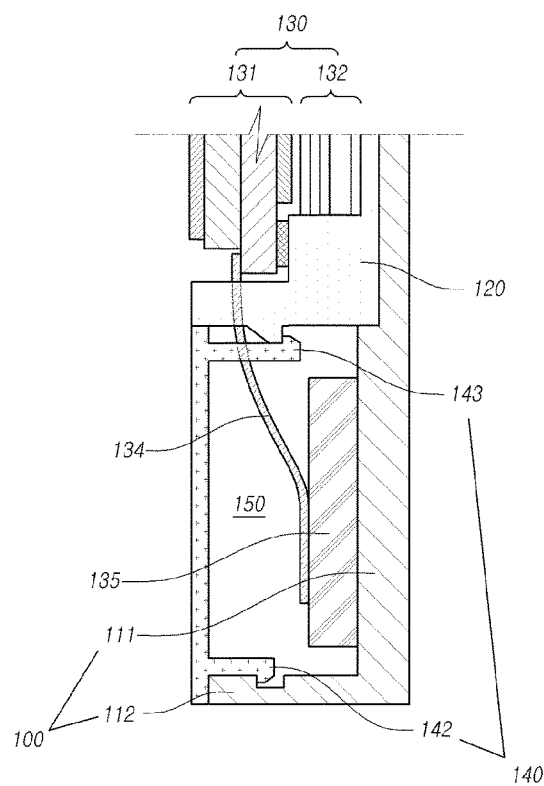
FIG. 2 is a cross-sectional view of the decorative cover taken along line A-A in FIG. 1.

Hereinafter, reference will be made to aspects of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure may be rendered unclear thereby.

It will also be understood that, while terms such as "first," "second," "A," "B," "(a)," and "(b)" may be used herein to describe various elements, such terms are merely used to distinguish one element from another element. The substance, sequence, order, or number of these elements is not limited by these terms. It will be understood that when an element is referred to as being "connected to" or "coupled to" another element, not only can it be "directly connected or coupled to" the other element, but it can also be "indirectly connected or coupled to" the other element via an "intervening" element. In the same context, it will be understood that when an element is referred to as being formed "on" or "under" another element, not only can it be directly formed on or under another element, but it can also be indirectly formed on or under another element via an intervening element.

Figure 3:
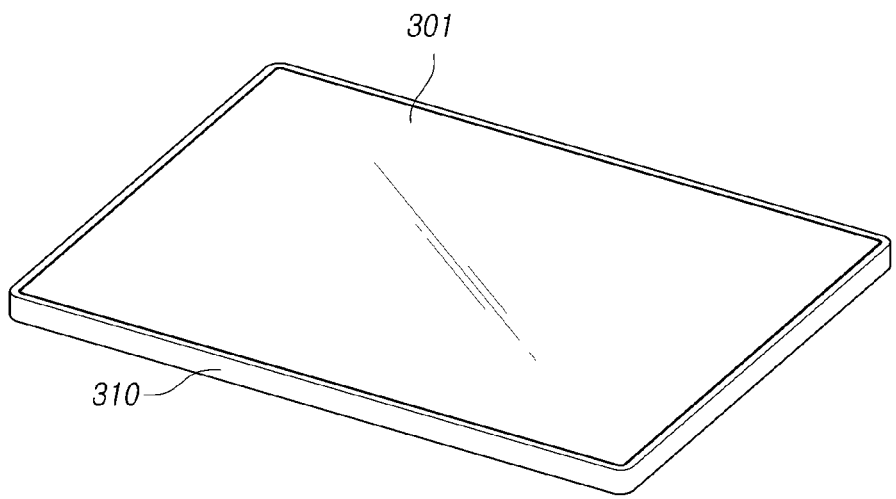
FIG. 3 is a perspective view illustrating a display device according to an aspect of the present disclosure.
Figure 4:
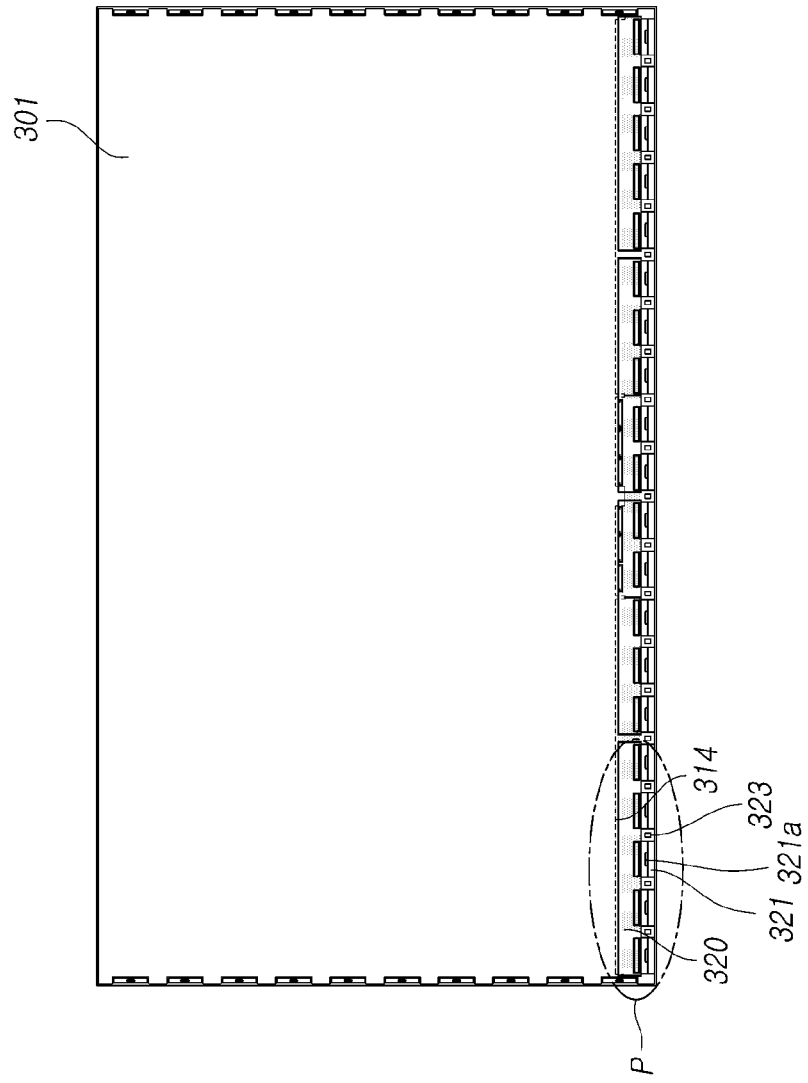
FIG. 4 is a rear view illustrating portions of the display device according to aspects of the present disclosure.
Figure 5:
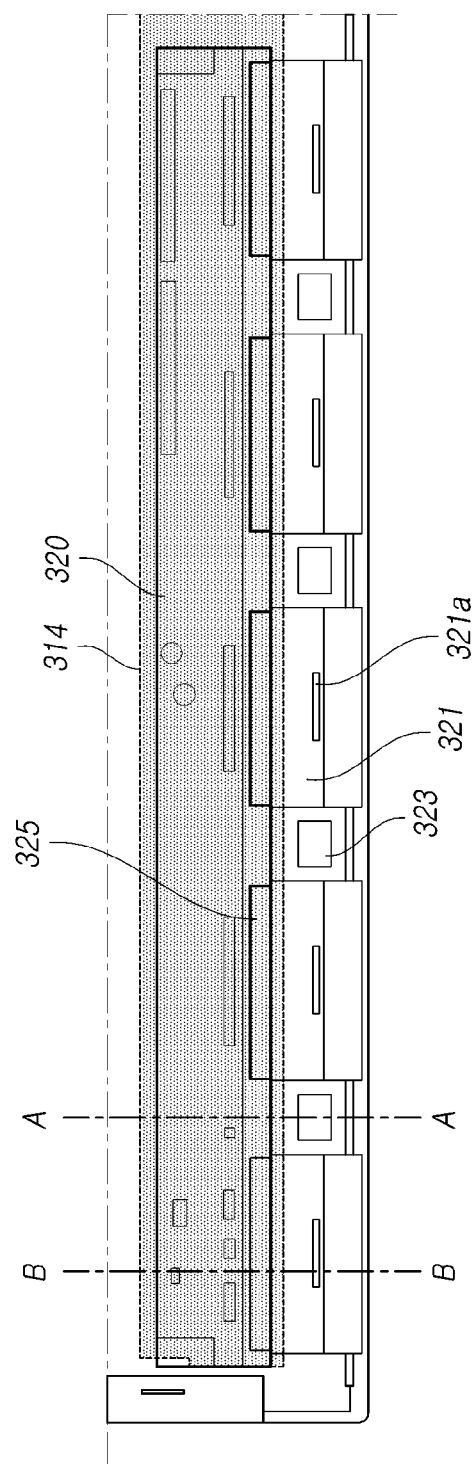
FIG. 5 is an enlarged view of part P in FIG. 4.
Figure 6:
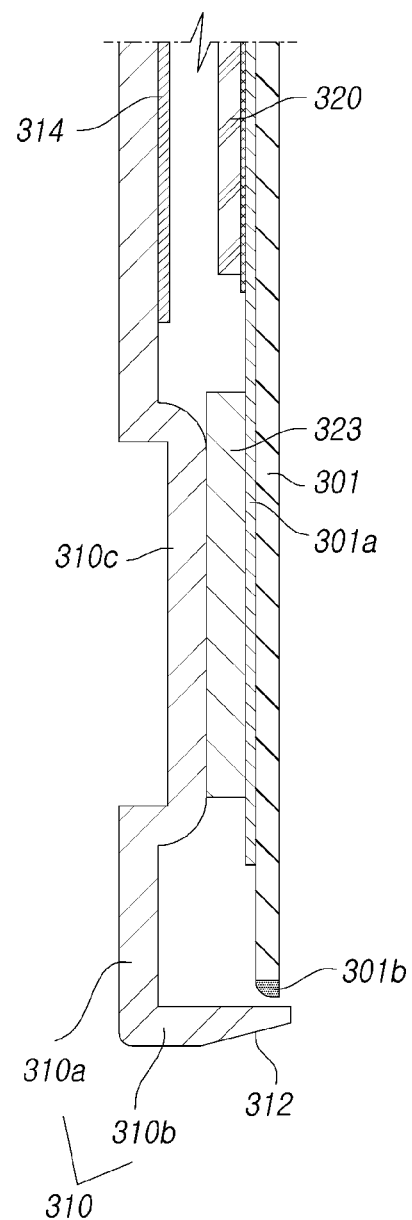
FIG. 6 is a cross-sectional view taken along line A-A in FIG. 5.
Figure 7:
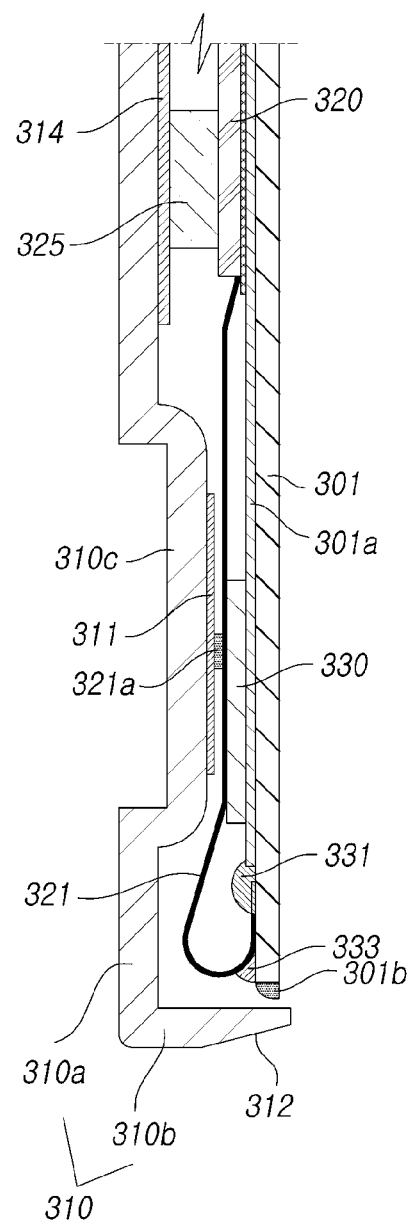
FIG. 7 is a cross-sectional view taken along line B-B in FIG. 5.
Figure 8:
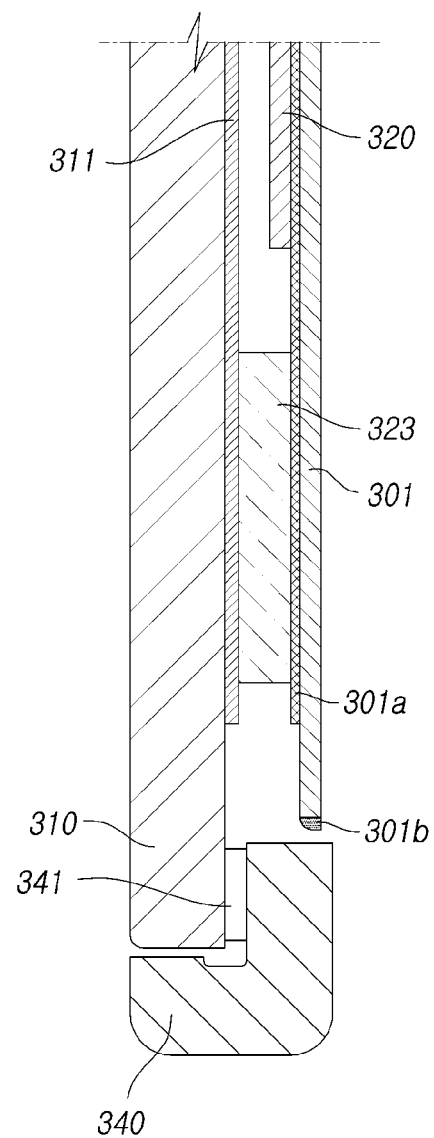
FIGS. 8 and 9 are cross-sectional views illustrating other aspects of the disclosure, corresponding to the cross-section taken along line A-A in FIG. 5.
Figure 9:
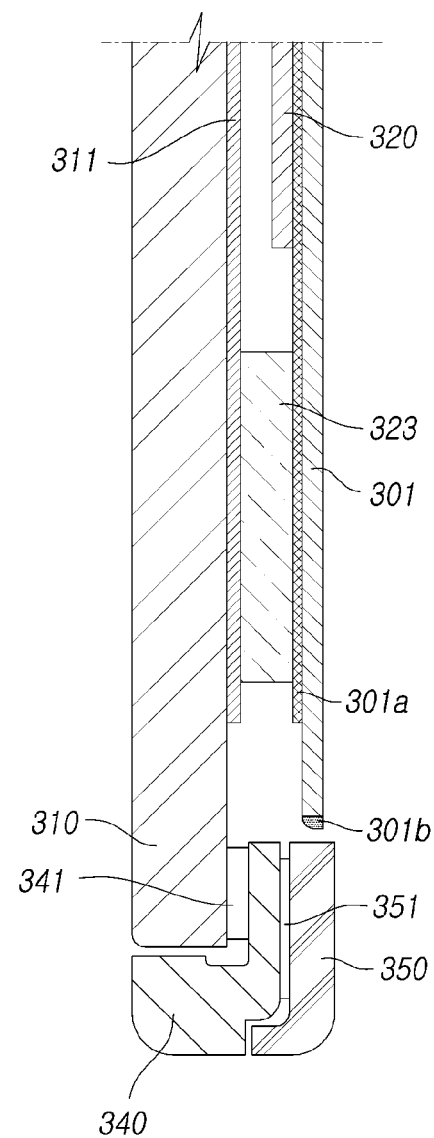
Figure 10:
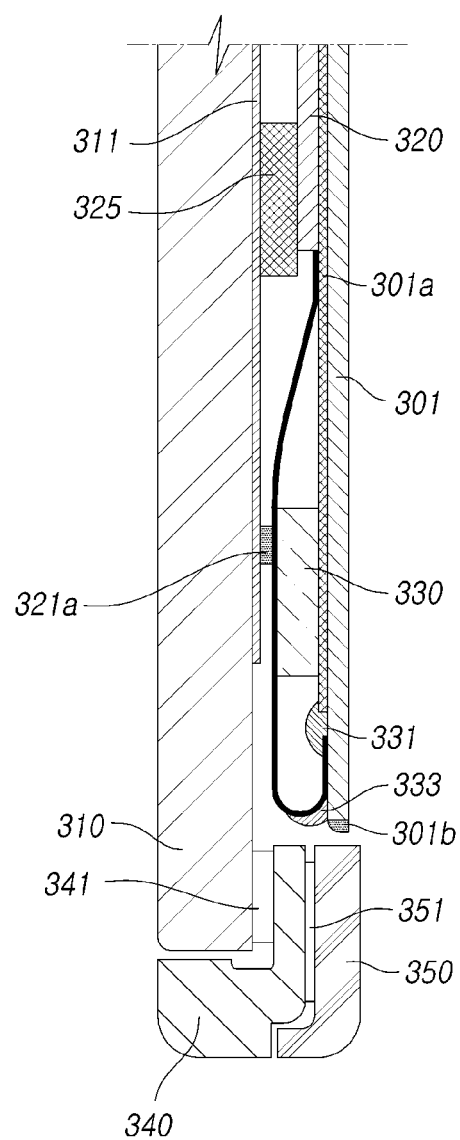
FIG. 10 is a cross-sectional view illustrating the other aspect of the disclosure, corresponding to the cross-section taken along line B-B in FIG. 5.

FIG. 3 is a perspective view illustrating a display device according to exemplary aspects, FIG. 4 is a rear view illustrating portions of the display device according to aspects of the present disclosure, FIG. 5 is an enlarged view of part P in FIG. 4, FIG. 6 is a cross-sectional view taken along line A-A in FIG. 5, FIG. 7 is a cross-sectional view taken along line B-B in FIG. 5, FIGS. 8 and 9 are cross-sectional views illustrating other aspects of the present disclosure, corresponding to the cross-section taken along line A-A in FIG. 5, and FIG. 10 is a cross-sectional view illustrating the other aspects of the disclosure, corresponding to the cross-section taken along line B-B in FIG. 5.

As illustrated in the drawings, a display device 300 according to exemplary aspects includes a display panel 301, a plurality of circuit films 321, a back cover 310, and a plurality of first support members 325. In each of the plurality of circuit films 321, one edge is connected to the display panel 301 and the other edge is connected to a printed circuit board (PCB) 320. The plurality of circuit films 321 are bendable, to have a curved shape, to be arranged in parallel to the rear surface of the display panel 301, in a position spaced apart from one edge (i.e. the bottom edge in the drawings) of the display panel 301. The plurality of circuit films 321 are spaced apart from each other along the edge of the display panel 301. The back cover 310 is disposed on the rear surface of the display panel 301, such that the circuit films 321 and the PCB 320 are accommodated in the display device 300. The plurality of first support members 325 are attached to the PCB 320 and the back cover 310 while supporting the PCB 320 and the back cover 310, such that a distance between the PCB 320 and the back cover 310 is maintained.

First, comparing FIG. 3 with FIG. 1, it can be appreciated that the width of the peripheral portion, i.e. the bezel width, of the display device 300 according to exemplary aspects is significantly reduced from that of the related art display device. In particular, the width of the back cover 310 corresponding to the bottom bezel is significantly reduced, as compared to the bezel width W1 of the related art display device, such that a narrow bezel design can be realized.

Differently from the related art device, in the display device 300 according to exemplary aspects, the circuit films 321 and the PCB 320 are arranged in parallel to the rear surface of the display panel 301 to reduce the bezel width, as illustrated in FIGS. 4 to 10.

As illustrated in FIGS. 4 and 5, the plurality of circuit films 321 is spaced apart from each other along the edge of the display panel 301. One edge of each of the circuit films 321 is electrically connected to the display panel 301, and the other edge of each of the circuit films 321 is electrically connected to the PCB 320. The circuit films 321 are bent, to have a curved shape, to be arranged in parallel to the rear surface of the display panel 301, in a position spaced apart from one edge (i.e. the bottom edge in the drawings) of the display panel 301.

This configuration can maximally reduce the bezel width compared to the related art. In particular, the bezel width in the edge of the display panel 301 adjacent to the circuit films 321 is significantly reduced, such that a narrow bezel can be realized.

The display panel 301 according to exemplary aspects is applicable to the display panel regardless of whether the display panel is an LCD panel or a light-emitting display panel.

When the display panel 301 is an LCD panel, the display device may further include a backlight unit irradiating light onto the LCD panel, a bottom polarizer attached to a bottom substrate, and a top polarizer attached to the top surface of a top substrate. The configurations of the bottom substrate and the top substrate may be selected from a variety of shapes known in the art, depending on the driving mode of the LCD panel, such as a twisted nematic (TN) mode, a vertical alignment (VA) mode, an in-plane switching (IPS) mode, and a fringe field switching (FFS) mode.

In addition, when the display panel 301 is a light-emitting display panel, the light-emitting display panel 301 may include a bottom substrate including a plurality of light-emitting cells located in areas defined by a plurality of gate lines, a plurality of data lines, and a plurality of supply voltage (VDD) lines. The light-emitting display panel 301 further includes a top substrate attached to the bottom substrate and facing the bottom substrate.

In addition, each of the plurality of light-emitting cells defined in the bottom substrate includes at least one switching transistor connected to a gate line among the plurality of gate lines and a data line among the plurality of data lines, at least one driving transistor connected to the switching transistor and a supply voltage line among the plurality of supply voltage lines, and a light-emitting device, e.g. an organic light-emitting diode (OLED), emitting light in response to a current controlled by switching of the driving transistor. The composition of the top substrate includes a moisture absorbent, or the like, to protect the light-emitting device from moisture or oxygen in the ambient air.

The top substrate may further include a light-emitting device connected to a driving transistor. In this case, the light-emitting device in the bottom substrate may be omitted.

According to exemplary aspects, the light-emitting display panel 301 is illustrated by way of example shown in FIGS. 3 to 10. Since the light-emitting display panel 301 is configured to irradiate light by itself, the backlight unit emitting light is not illustrated. Hereinafter, the display panel 301 will be described as being a light-emitting display panel.

An organic compound contained in an array of pixels (or subpixels) of the light-emitting display panel may be deteriorated when exposed to moisture or oxygen. To prevent the problem of deteriorated pixels, an encapsulation member 301a is bonded to the rear surface of the display panel 301 to seal the array of pixels.

The encapsulation member 301a may be a metal substrate or a glass substrate. A polarizer film (not shown) may be bonded to the front surface of the display panel 301.

To prevent a light leakage phenomenon in which light from the array of pixels leaks through the side surface of the display panel 301, side seal members 301b are provided on side surfaces of the display panel 301.

The side seal members 301b may be made of a polymer material to which a black pigment is added. The side seal members 301b absorb light irradiated thereto from the array of pixels, so that light exiting through the side surfaces of the display panel 301 is prevented.

On at least one portion of the rectangular rear surface of the display panel 301, adjacent to at least one edge of the display panel 301, the plurality of flexible circuit films 321 having driving integrated circuits (ICs) 321a mounted thereon are electrically connected to the display panel 301 and the PCB 320, and the PCB 320 is disposed in parallel to the display panel 301.

The plurality of flexible circuit films 321 are attached to the display panel 301 and the PCB 320 by means of a fixing member 331, such as a resin, by tape automated bonding (TAB). The plurality of flexible circuit films 321 may be one of tape carrier packages (TCPs), chip-on-flexible boards and chip-on-films (COFs).

Thus, the display panel 301 is electrically connected or joined to the PCB 320 via the plurality of flexible circuit films 321. The PCB 320 is electrically connected to the plurality of flexible circuit films 321 to supply a variety of signals to display images on the display panel 301.

The PCB 320 is electrically connected to the plurality of flexible circuit films 321 to provide a variety of signals to display images on the display panel 301, and the driving ICs 321a or the like for controlling the driving of the display panel 301 are mounted on the PCB 320.

The back cover 310 is provided on the rear surface of the display panel 301, such that the circuit films 321 and the PCB 320 are accommodated in the display device 300. The back cover 310 can protect internal components, such as the circuit films 321, the ICs 321a mounted on the circuit films 321, and the PCB 320, as well as the rear surface of the display panel 301.

The first support members 325 are attached between the PCB 320 and the back cover 310 while supporting the PCB 320 and the back cover 310 such that the distance therebetween can be maintained. This configuration can protect the bent circuit films 321, the ICs, the PCB 320, and the like. An insulating member 314, such as graphite or an adhesive insulation tape, is disposed on a portion of the back cover 310 corresponding to the PCB 320.

The first support members 325 are attached to the PCB 320 and the back cover 310 while supporting the PCB 320 and the back cover 310 such that the distance therebetween can be maintained in order to prevent the circuit films 321 or the PCB 320 from being damaged by the pressing force of bonding rollers during a bonding process of the display panel 301 and the back cover 310 or by any physical pressing force caused by a variety of reasons after the bonding process.

In addition, exemplary aspects further provide second support members 323 disposed between the circuit films 321 spaced apart from each other. The second support members 323 are situated between the display panel 301 and the back cover 310 while supporting the display panel 301 and the back cover 310 to prevent problems, in particular, caused by the circuit films 321 being pulled and skewed in any direction or the bends of the circuit films 321 being bent in an angled shape or folded.

Since the second support members 323 are disposed between the circuit films 321 while maintaining the distance between the display panel 301 and the back cover 310, the circuit films 321 can be protected from either the pressing force of the bonding rollers during the bonding process or pressing force after the bonding process.

In addition, exemplary aspects further include third support members 330 attached between the rear surface of the display panel 301 and the circuit films 321 while supporting the rear surface of the display panel 301 and the circuit films 321 such that a distance can be maintained therebetween. The third support members 330 can absorb impacts or pressing force delivered through the back cover 310 while maintaining the distance between the rear surface of the display panel 301 and the circuit films 321, thereby preventing the circuit films 321 from being deformed or damaged.

Each of the first support members 325, the second support members 323, and the third support members 330 may be implemented as an adhesive insulating tape, an adhesive thermal conduction tape, or the like, made of a flexible material having a predetermined thickness to absorb physical impacts. At least one type of members among the first support members 325, the second support members 323, and the third support members 330 may be made of a thermal interface material (TIM).

The first support members 325, the second support members 323, and the third support members 330 may be made of a resin composition, such as epoxy, to which heat conducting fillers are added. The heat conducting fillers may be metal particles made of one of graphite, aluminum (Al), copper (Cu), nickel (Ni), and silver (Ag).

On portions of the back cover 310, to which the second support members 323 are attached, stepped portions 310c protrude toward the display panel 301 to increase the strength of the back cover 310 without increasing the thickness of the display device.

Heat dissipating members 311 are provided on the inner surfaces of the stepped portions 310c of the back cover 310. The driving ICs 321a mounted on the circuit films 321 are in close contact with and supported by the heat dissipating members 311, such that heat generated by the driving ICs 321a is rapidly discharged to the back cover 310 through the heat dissipating members 311.

The heat dissipating members 311 may be made of graphite, an adhesive heat conductive tape, a thermal interface material (TIM), or the like.

Resin members 333 are provided on the rear surface of the display panel 301, outside of the bent portion of the circuit films 321, to maintain the curvature of the bend of the circuit films 321, thereby preventing problems caused by the bend of the circuit films 321 being bent in an angled shape or folded.

The back cover 310 includes a first plate 310a disposed at the rear of the display panel 301 and a second plate 310b bent from an edge of the first plate 310a toward the corresponding edge of the display panel 301 to protect the circuit films 321 and the edge of the display panel 301. One or more second plates 310b having the same configuration may be provided on one or more of the remaining edges of the first plate 310a.

With this configuration, the back cover 310 serves to protect the internal components, such as the circuit films 321 and the PCB 320, as well as the edges of the display panel 301, from external impacts while covering the rear surface and the edges of the display panel 301.

The back cover 310 has inclined surfaces 312 on the outer surfaces of the second plates 310b. The inclined surfaces 312 are shaped to decrease the thicknesses of the second plates 310b toward the distal ends of the second plates 310b. This configuration can maximize a visual effect in which the bezel width looks minimized when the display device is viewed from the front.

The back cover 310 is made of a metal material, such as aluminum (Al), aluminum alloy, stainless steel, and galvanized steel. The back cover 310 may be made of a glass material to prevent the back cover 310 from being thermally expanded or thermally deformed while reinforcing the strength of the back cover 310.

As illustrated in FIGS. 8 to 10, when the back cover 310 is made of glass, a middle cabinet 340 is provided on an edge of the back cover 310. The middle cabinet 340 is attached to the back cover 310 by means of, for example, a bonding material 341. The middle cabinet 340 may further be provided on one or more edges of the remaining edges of the back cover 310. The middle cabinet 340 is attached to the edge of the back cover 310 to cover the circuit films 321, thereby protecting the circuit films 321 and the edge of the display panel 301.

The back cover 310 made of glass, illustrated in FIG. 8, is free from thermal expansion and thermal deformation due to the hardness of glass being higher than that of metal. Due to this characteristic feature, as illustrated in FIG. 8, the back cover 310 made of glass is attached to the display panel 301 without the stepped portion 310c in a position in which the second support member 323 is attached to the display panel 301, differently from the metal back cover 310 illustrated in FIGS. 6 and 7.

In addition, as illustrated in FIGS. 9 and 10, a decorative cover 350 is attached to the front surface of the middle cabinet 340. The decorative cover 350 attached to the front surface of the middle cabinet 340 can improve the aesthetic design quality of the display device.

Although the display device according to exemplary aspects has been illustrated, by way of example, as being a light-emitting display panel in the drawings, exemplary aspects are applicable to the LCD panel as described above. In this case, the backlight module irradiating light to the LCD panel may include a light source module, a light guide plate providing the LCD panel with suitable light by processing light emitted by the light source module, a light-adjusting member, a light reflector, and the like. The light source module is a component converting electrical energy into light energy, which may be implemented as a light-emitting diode (LED) assembly, a cold cathode fluorescent lamp (CCFL), a hot cathode fluorescent lamp (HCFL), or the like. No further detailed descriptions will be made, since these components are well-known in the art.

According to exemplary aspects as set forth above, the display device can have a narrow bezel, a slimmed profile, and a light weight, in which the width of peripheral portions of the front surface is significantly reduced.

In addition, according to exemplary aspects, it is possible to protect the plurality of circuit films, the PCB, and the like connected to the display panel and improve heat dissipation performance while significantly reducing the width of the peripheral portions of the front surface.

Although all of the components constituting exemplary aspects have been described as being combined together or as operating in concert with each other, the present disclosure is not necessarily limited thereto. Rather, one or more components may be selected from the entire components to be combined together and operate in a combined form within the scope of the present disclosure.

It will be understood that the terms "comprise," "include," "have," and any variations thereof used herein are intended to cover non-exclusive inclusions unless explicitly described to the contrary. Unless otherwise defined, all terms including technical and scientific terms used herein have the same meaning as commonly understood by a person skilled in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

The foregoing descriptions and the accompanying drawings have been presented in order to explain the certain principles of the present disclosure. A person skilled in the art to which the present disclosure relates could make many modifications and variations by combining, dividing, substituting for, or changing the elements without departing from the principle of the present disclosure. The foregoing aspects disclosed herein shall be interpreted as illustrative only but not as limitative of the principle and scope of the present disclosure. It should be understood that the scope of the present disclosure shall be defined by the appended Claims and all of their equivalents fall within the scope of the present disclosure.

What is claimed is:

1. A display device, comprising:
a display panel;
a printed circuit board engaged with the display panel;

a plurality of flexible circuit films having one end connected to the display panel and the other end connected to the printed circuit board, wherein the plurality of flexible circuit films is arranged in parallel with each other at a rear surface of the display panel;

a back cover disposed on the rear surface of the display panel, such that the plurality of flexible circuit films and the printed circuit board are accommodated in the display device;

a plurality of first support members configured to support the printed circuit board and the back cover, and maintain a distance between the printed circuit board and the back cover; and a plurality of second support members disposed at a space between each adjacent flexible circuit films of the plurality of flexible circuit films and configured to support the display panel and the back cover, wherein the back cover comprising:

a plurality of stepped portions where the plurality of second support members are attached, the stepped portions protruding toward the display panel, a first plate disposed at the rear of the display panel, and a second plate bent from an edge of the first plate toward an edge of the display panel to protect the flexible circuit films and the edge of the display panel, wherein bending portions of the flexible circuit films are positioned in a space between the display panel and the first plate below the stepped portions.

2. The display device according to claim 1, wherein the plurality of flexible circuit films are spaced apart from a predetermined edge of the display panel, and the one end and the other end are spaced apart from each other along the predetermined edge of the display panel.

3. The display device according to claim 1, further comprising a plurality of third support members supporting the display panel and the plurality of flexible circuit films and maintaining a distance between the display panel and the plurality of flexible circuit films.

4. The display device according to claim 1, further comprising a plurality of heat dissipating members disposed on inner surfaces of the plurality of stepped portions of the back cover.

5. The display device according to claim 4, wherein each of the plurality of flexible circuit films comprises a driving integrated circuit in close contact with and supported by the plurality of heat dissipating members.

6. The display device according to claim 1, further comprising a plurality of resin members provided on the rear surface of the display panel, outside of bent portions of the flexible circuit films and maintaining a shape of the bent portions of the flexible circuit films.

7. The display device according to claim 6, wherein the second plate of the back cover has an inclined surface at an outer end, the inclined surface having a gradually decreasing thickness toward an end of the second plate.

8. The display device according to claim 1, further comprising a middle cabinet attached to an edge of the back cover to cover the flexible circuit films and protecting the flexible circuit films and an edge of the display panel corresponding thereto.

9. The display device according to claim 8, further comprising a decorative cover attached to the middle cabinet to improve an aesthetic design quality of the display device.

\* \* \* \* \*